(12) United States Patent
Martinez et al.

(10) Patent No.: US 10,297,427 B2
(45) Date of Patent: May 21, 2019

(54) METHOD AND APPARATUS FOR PLASMA DICING A SEMI-CONDUCTOR WAFER

(71) Applicant: Plasma-Therm LLC, St. Petersburg, FL (US)

(72) Inventors: Linnell Martinez, Lakeland, FL (US); David Pays-Volard, St. Petersburg, FL (US); Chris Johnson, St. Petersburg, FL (US); David Johnson, Cleveland, GA (US); Russell Westerman, Land O' Lakes, FL (US); Gordon M. Grivna, Mesa, AZ (US)

(73) Assignee: Plasma-Therm LLC, St. Petersburg, FL (US)

( * ) Notice: Subject to any disclaimer, the term of this patent is extended or adjusted under 35 U.S.C. 154(b) by 44 days.

(21) Appl. No.: 14/842,365

(22) Filed: Sep. 1, 2015

(65) Prior Publication Data

US 2015/0371878 A1    Dec. 24, 2015

Related U.S. Application Data

(62) Division of application No. 13/764,177, filed on Feb. 11, 2013, now Pat. No. 9,202,720, which is a division
(Continued)

(51) Int. Cl.
*H01J 37/32* (2006.01)
*H01L 21/67* (2006.01)
(Continued)

(52) U.S. Cl.
CPC ...... *H01J 37/32623* (2013.01); *H01J 37/321* (2013.01); *H01J 37/32155* (2013.01);
(Continued)

(58) Field of Classification Search
CPC ......... H01J 37/32623–32651; H01J 37/32422; H01J 37/32743; H01L 21/6831–6833
See application file for complete search history.

(56) References Cited

U.S. PATENT DOCUMENTS 5,669,977 A     9/1997   Shufflebotham et al.
5,685,914 A  *  11/1997  Hills ................. H01J 37/32449
                                                118/723 E
(Continued)

FOREIGN PATENT DOCUMENTS

WO        WO0104945         1/2001

OTHER PUBLICATIONS

SPTS Technologies Ltd, Petition for Inter Partes Review of U.S. Pat. No. 8,802,545 Under 35 U.S.C. §§311-319 and 37 C.F.R. §42.100 et seq., dated Jun. 24, 2017.
(Continued)

*Primary Examiner* — Erik T. K. Peterson
(74) *Attorney, Agent, or Firm* — Burr & Forman LLP; Harvey S. Kauget

(57) ABSTRACT

The present invention provides a method for plasma dicing a substrate. The method comprising providing a process chamber having a wall; providing a plasma source adjacent to the wall of the process chamber; providing a work piece support within the process chamber; placing the substrate onto a support film on a frame to form a work piece work piece; loading the work piece onto the work piece support; providing a cover ring disposed above the work piece; generating a plasma through the plasma source; and etching the work piece through the generated plasma.

6 Claims, 16 Drawing Sheets

Related U.S. Application Data of application No. 13/412,119, filed on Mar. 5, 2012, now Pat. No. 8,802,545.

(60) Provisional application No. 61/452,450, filed on Mar. 14, 2011.

(51) Int. Cl.

| | | |
|---|---|---|
| *H01L 21/683* | (2006.01) | |
| *H01L 21/68* | (2006.01) | |
| *H01L 21/78* | (2006.01) | |
| *H01L 21/687* | (2006.01) | |
| *H01L 21/3065* | (2006.01) | |
| *H01L 21/677* | (2006.01) | |
| *H01L 21/311* | (2006.01) | |

(52) U.S. Cl.
CPC .. *H01J 37/32642* (2013.01); *H01J 37/32651* (2013.01); *H01J 37/32724* (2013.01); *H01L 21/3065* (2013.01); *H01L 21/30655* (2013.01); *H01L 21/67069* (2013.01); *H01L 21/68* (2013.01); *H01L 21/6831* (2013.01); *H01L 21/6833* (2013.01); *H01L 21/68735* (2013.01); *H01L 21/68742* (2013.01); *H01L 21/78* (2013.01); *H01J 37/32422* (2013.01); *H01L 21/31116* (2013.01); *H01L 21/67739* (2013.01); *H01L 2221/68327* (2013.01); *Y10S 414/139* (2013.01)

(56) References Cited

U.S. PATENT DOCUMENTS

| | | | | |
|---|---|---|---|---|
| 5,783,100 | A * | 7/1998 | Blalock | H01L 21/02 216/67 |
| 5,919,332 | A * | 7/1999 | Koshiishi | C23C 16/5096 118/723 E |
| 6,051,503 | A | 4/2000 | Bhardwaj et al. | |
| 6,071,822 | A | 6/2000 | Donohue et al. | |
| 6,106,737 | A * | 8/2000 | Tomoyasu | C23C 16/4405 204/192.12 |
| 6,125,788 | A * | 10/2000 | Hills | H01J 37/32082 118/723 MP |
| 6,451,184 | B1 * | 9/2002 | Sone | C23C 14/0057 204/298.06 |
| 6,465,158 | B1 | 10/2002 | Sekiya | |
| 6,483,690 | B1 | 11/2002 | Nakajima et al. | |
| 6,935,466 | B2 | 8/2005 | Lubomirsky et al. | |
| 6,951,821 | B2 | 10/2005 | Hamelin et al. | |
| 7,411,384 | B2 | 8/2008 | Ogasawara et al. | |
| 7,449,071 | B2 | 11/2008 | Aggarwal et al. | |
| 7,896,047 | B2 | 3/2011 | Yamamoto | |
| 8,191,505 | B2 | 6/2012 | Kamaishi et al. | |
| 2001/0006093 | A1 * | 7/2001 | Tabuchi | C23C 16/24 156/345.43 |
| 2001/0013504 | A1 * | 8/2001 | Imafuku | C23C 16/4405 216/71 |
| 2001/0019472 | A1 * | 9/2001 | Kanno | H01L 21/6833 361/234 |
| 2002/0042204 | A1 * | 4/2002 | Hayashi | H01J 37/32082 438/710 |
| 2002/0185226 | A1 * | 12/2002 | Lea | H01J 37/32357 156/345.35 |
| 2003/0216034 | A1 | 11/2003 | Westerman et al. | |
| 2004/0115901 | A1 | 6/2004 | Sekiya | |
| 2004/0182315 | A1 * | 9/2004 | Laflamme, Jr. | C25D 11/02 118/715 |
| 2005/0229370 | A1 | 10/2005 | Kobayashi | |
| 2006/0000805 | A1 * | 1/2006 | Todorow | C23F 4/00 216/68 |
| 2006/0016559 | A1 * | 1/2006 | Kobayashi | H01J 37/32082 156/345.34 |
| 2006/0102286 | A1 | 5/2006 | Kim | |
| 2006/0164785 | A1 | 7/2006 | Pellegrin | |
| 2006/0254717 | A1 * | 11/2006 | Kobayashi | C23F 4/00 156/345.44 |
| 2007/0238199 | A1 | 10/2007 | Yamashita | |
| 2008/0071408 | A1 * | 3/2008 | Hiroki | H01L 21/681 700/114 |
| 2008/0076268 | A1 * | 3/2008 | Kraus | H01L 21/28185 438/785 |
| 2008/0099431 | A1 * | 5/2008 | Kumar | H01J 37/32422 216/44 |
| 2009/0008034 | A1 * | 1/2009 | Tahara | H01J 37/321 156/345.35 |
| 2009/0183583 | A1 | 7/2009 | Nisany et al. | |
| 2009/0183833 | A1 * | 7/2009 | Kim | C23C 16/452 156/345.33 |
| 2010/0175622 | A1 * | 7/2010 | Yoon | H01J 37/321 118/723 R |
| 2010/0216313 | A1 * | 8/2010 | Iwai | H01J 37/32623 438/729 |
| 2011/0174606 | A1 * | 7/2011 | Funk | H01J 37/32009 204/164 |
| 2011/0177694 | A1 * | 7/2011 | Chen | H01J 37/321 438/710 |
| 2012/0305184 | A1 * | 12/2012 | Singh | H01J 37/321 156/345.3 |
| 2012/0322239 | A1 | 12/2012 | Singh et al. | |
| 2014/0213041 | A1 | 7/2014 | Lei et al. | |

OTHER PUBLICATIONS

Declaration of Dr. John Spencer from Petition for Inter Parties Review of U.S. Pat. No. 8,802,545 Under 35 U.S.C. §§311-319 and 37 C.F.R. §42.100 et seq., dated Jun. 24, 2017.
SPTS Technologies Ltd, Petition for Inter Parties Review of U.S. Pat. No. 9,105,705 Under 35 U.S.C. §§311-319 and 37 C.F.R. §42.100 et seq., dated Jul. 17, 2017.
Declaration of Dr. John Spencer from Petition for Inter Parties Review of U.S. Pat. No. 9,105,705 Under 35 U.S.C. §§311-319 and 37 C.F.R. §42.100 et seq., dated Jul. 17, 2017.
SPTS Technologies Ltd, Petition for Inter Parties Review of U.S. Pat. No. 8,980,764 Under 35 U.S.C. §§311-319 and 37 C.F.R. §42.100 et seq., dated Apr. 24, 2017.
Declaration of Dr. John Spencer from Petition for Inter Parties Review of U.S. Pat. No. 8,980,764 Under 35 U.S.C. §§311-319 and 37 C.F.R. §42.100 et seq., dated Apr. 24, 2017.
SPTS Technologies Ltd, Petition for Inter Parties Review of U.S. Pat. No. 9,202,720 Under 35 U.S.C. §§311-319 and 37 C.F.R. §42.100 et seq., dated May 22, 2017.
Declaration of Dr. John Spencer from Petition for Inter Parties Review of U.S. Pat. No. 9,202,720 Under 35 U.S.C. §§311-319 and 37 C.F.R. §42.100 et seq., dated May 22, 2017.
SPTS Technologies Ltd, Petition for Inter Parties Review of U.S. Pat. No. 9,070,760 Under 35 U.S.C. §§311-319 and 37 C.F.R. §42.100 et seq., dated Sep. 23, 2017.
Declaration of Dr. John Spencer from Petition for Inter Parties Review of U.S. Pat. No. 9,070,760 Under 35 U.S.C. §§311-319 and 37 C.F.R. §42.100 et seq., dated Sep. 23, 2017.
SPTS Technologies Ltd, Petition for Inter Parties Review of U.S. Pat. No. 8,785,332 Under 35 U.S.C. §§311-319 and 37 C.F.R. §42.100 et seq., dated Feb. 12, 2018.
Declaration of Dr. John Spencer from Petition for Inter Parties Review of U.S. Pat. No. 8,785,332 Under 35 U.S.C. §§311-319 and 37 C.F.R. §42.100 et seq., dated Feb. 9, 2018.

* cited by examiner

METHOD AND APPARATUS FOR PLASMA DICING A SEMI-CONDUCTOR WAFER

CROSS REFERENCES TO RELATED APPLICATIONS

This utility patent application is a divisional of commonly owned U.S. Utility patent application Ser. No. 13/764,177 entitled: Method and Apparatus for Plasma Dicing a Semi-conductor Wafer, which was a divisional of commonly owned U.S. Utility patent application Ser. No. 13/412,119 entitled: Method and Apparatus for Plasma Dicing a Semi-conductor, Wafer, which was filed based on U.S. Provisional Application No. 61/452,450 filed Mar. 14, 2011, entitled: Apparatus for Plasma Dicing a Semi-conductor Wafer, this Utility Patent Application incorporated by reference herein.

FIELD OF THE INVENTION

The invention relates to the use of an apparatus for the formation of individual device chips from a semi-conductor wafer, and in particular to an apparatus which uses plasma etching to separate the wafer into individual die.

BACKGROUND

Semi-conductor devices are fabricated on substrates which are in the form of thin wafers. Silicon is commonly used as the substrate material, but other materials, such as III-V compounds (for example GaAs and InP) are also used. In some instances (for example, the manufacture of LED's) the substrate is a sapphire or silicon carbide wafer on which a thin layer of a semi-conducting material is deposited. The size of such substrates ranges from 2 inches and 3 inches up to 200 mm, 300 mm, and 450 mm diameter and many standards exist (e.g., SEMI) to describe such substrate sizes.

Plasma etching equipment is used extensively in the processing of these substrates to produce semi-conductor devices. Such equipment typically includes a vacuum chamber fitted with a high density plasma source such as Inductively Coupled Plasma (ICP) which is used to ensure high etch rates, necessary for cost-effective manufacturing. In order to remove the heat generated during the processing, the substrate is typically clamped to a cooled support. A cooling gas (typically Helium) is maintained between the substrate and the support to provide a thermal conductance path for heat removal. A mechanical clamping mechanism, in which a downward force is applied to the top side of the substrate, may be used, though this may cause contamination due to the contact between the clamp and the substrate. More frequently an Electrostatic chuck (ESC) is used to provide the clamping force.

Numerous gas chemistries appropriate to the material to be etched have been developed. These frequently employ a halogen (Fluorine, Chlorine, Bromine, or Iodine) or halogen-containing gas together with additional gases added to improve the quality of the etch (for example, etch anisotropy, mask selectivity and etch uniformity). Fluorine containing gases, such as $SF_6$, $F_2$ or $NF_3$ are used to etch silicon at a high rate. In particular, a process (Bosch or TDM) which alternates a high rate silicon etch step with a passivation step to control the etch sidewall, is commonly used to etch deep features into silicon. Chlorine and Bromine containing gases are commonly used to etch III-V materials.

Plasma etching is not limited to semiconducting substrates and devices. The technique may be applied to any substrate type where a suitable gas chemistry to etch the substrate is available. Other substrate types may include carbon containing substrates (including polymeric substrates), ceramic substrates (e.g., AlTiC and sapphire), metal substrates, and glass substrates.

To ensure consistent results, low breakage and ease of operation, robotic wafer handling is typically used in the manufacturing process. Handlers are designed to support the wafers with minimal contact, to minimize possible contamination and reduce the generation of particulates. Edge contact alone, or underside contact close to the wafer edge at only a few locations (typically within 3-6 mm of the wafer edge) is generally employed. Handling schemes, which include wafer cassettes, robotic arms and within process chamber fixtures including the wafer support and ESC, are designed to handle the standard wafer sizes as noted previously.

After fabrication on the substrate, the individual devices (die or chips) are separated from each other prior to packaging or being employed in other electronic circuitry. For many years, mechanical means have been used to separate the die from each other. Such mechanical means have included breaking the wafer along scribe lines aligned with the substrate crystal axis or by using a high speed diamond saw to saw into or through the substrate in a region (streets) between the die. More recently, lasers have been used to facilitate the scribing process.

Such mechanical wafer dicing techniques have limitations which affect the cost effectiveness of this approach. Chipping and breakage along the die edges can reduce the number of good die produced, and becomes more problematic as wafer thicknesses decrease. The area consumed by the saw bade (kerf) may be greater than 100 microns which is valuable area not useable for die production. For wafers containing small die (e.g., individual semiconductor devices with a die size of 500 microns×500 microns) this can represent a loss of greater than 20%. Further, for wafers with many small die and hence numerous streets, the dicing time is increased, and productivity decreased, since each street is cut individually. Mechanical means are also limited to separation along straight lines and the production of square or oblong shaped chips. This may not represent the underlying device topology (e.g., a high power diode is round) and so the rectilinear die format results in significant loss of useable substrate area. Laser dicing also has limitations by leaving residual material on the die surface or inducing stress into the die.

It is important to note that both sawing and laser dicing techniques are essentially serial operations. Consequently, as device sizes decrease, the time to dice the wafer increases in proportion to the total dicing street length on the wafer.

Recently plasma etching techniques have been proposed as a means of separating die and overcoming some of these limitations. After device fabrication, the substrate is masked with a suitable mask material, leaving open areas between the die. The masked substrate is then processed using a reactive-gas plasma which etches the substrate material exposed between the die. The plasma etching of the substrate may proceed partially or completely through the substrate. In the case of a partial plasma etch, the die are separated by a subsequent cleaving step, leaving the individual die separated. The technique offers a number of benefits over mechanical dicing:

1) Breakage and chipping is reduced;
2) The kerf dimensions can be reduced to well below 20 microns;
3) Processing time does not increase significantly as the number of die increases;

4) Processing time is reduced for thinner wafers; and

5) Die topology is not limited to a rectilinear format.

After device fabrication, but prior to die separation, the substrate may be thinned by mechanical grinding or similar process down to a thickness of a few hundred microns, or even less than a hundred microns.

Prior to the dicing process, the substrate is typically mounted on a dicing fixture. This fixture is typically comprised of a rigid frame that supports an adhesive membrane. The substrate to be diced is adhered to the membrane. This fixture holds the separated die for subsequent downstream operations. Most tools used for wafer dicing (saws or laser based tools) are designed to handle substrates in this configuration and a number of standard fixtures have been established; however, such fixtures are very different from the substrates which they support. Though such fixtures are optimized for use in current wafer dicing equipment, they cannot be processed in equipment which has been designed to process standard substrates. Thus, current automated plasma etching equipment is not suitable for processing substrates fixtured for dicing and it is difficult to realize the benefits that plasma etch techniques should have for die separation.

Some groups have contemplated using plasma to singulate die from wafer substrates. U.S. Pat. No. 6,642,127 describes a plasma dicing technique in which the substrate wafer is first attached to a carrier wafer via an adhesive material, before plasma processing in equipment designed for processing silicon wafers. This technique proposes adapting the form factor of the substrate to be diced to be compatible with standard wafer processing equipment. While this technique allows standard plasma equipment to dice the wafer, the proposed technique will not be compatible with standard equipment downstream of the dicing operation. Additional steps would be required to either adapt the downstream equipment or revert the substrate form factor for standard downstream equipment.

U.S. Patent Application 2010/0048001 contemplates the use of a wafer adhered to a thin membrane and supported within a frame. However, in the 2010/0048001 application, the masking process is achieved by adhering a mask material to the backside of the wafer and using a laser to define the etch streets prior to plasma processing. In contrast to standard dicing techniques which singulate the substrate from the front side, this technique introduces additional complex and expensive steps which may negate some of the advantages of plasma dicing. It also requires the additional demand of aligning the backside mask with the front side device pattern.

Therefore, what is needed is a plasma etching apparatus which can be used for dicing a semiconductor substrate into individual die and which is compatible with the established wafer dicing technique of handling a substrate mounted on tape and supported in a frame, and which is also compatible with standard front side masking techniques.

Nothing in the prior art provides the benefits attendant with the present invention.

Therefore, it is an object of the present invention to provide an improvement which overcomes the inadequacies of the prior art devices and which is a significant contribution to the advancement to the dicing of semiconductor substrates using a plasma etching apparatus.

Another object of the present invention is to provide a method for plasma dicing a substrate, the method comprising: providing a process chamber having a wall; providing a plasma source adjacent to the wall of the process chamber; providing a work piece support within the process chamber; placing the substrate on a carrier support to form a work piece; loading the work piece onto the work piece support; providing a cover ring disposed above the work piece; generating a plasma through the plasma source; and etching the work piece through the generated plasma.

Yet another object of the present invention is to provide a method for plasma dicing a substrate, the method comprising: providing a process chamber having a wall; providing a plasma source adjacent to the wall of the process chamber; providing a work piece support within the process chamber, the work piece support having an electrostatic chuck; placing the substrate on a carrier support to form a work piece; loading the work piece onto the work piece support; clamping the work piece to the work piece support through the electrostatic chuck; providing a cover ring disposed above the work piece; generating a plasma through the plasma source; etching the work piece through the generated plasma; and controlling temperature of the cover ring during the etching step.

Still yet another object of the present invention is to provide a method for plasma dicing a substrate, the method comprising: placing the substrate on a carrier support to form a work piece; loading the work piece into a plasma processing chamber; exposing the work piece in the plasma processing chamber to a first plasma etch process using a first etchant gas; terminating the first plasma etch process after singulation; and exposing the work piece in the plasma processing chamber to a second plasma etch process using a second etchant gas.

Another object of the present invention is to provide an apparatus for plasma dicing a substrate comprising: a process chamber having a wall; a plasma source adjacent to the wall of the process chamber; a work piece support within the process chamber, the work piece support having an electrostatic chuck; a work piece having the substrate on a carrier support, the work piece being placed onto the work piece support; and a cover ring disposed above the work piece, the cover ring is thermally coupled to the wall of the process chamber.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The present invention describes a plasma processing apparatus which allows for plasma dicing of a semiconductor substrate. After device fabrication and wafer thinning, the front side (circuit side) of the substrate is masked using conventional masking techniques which protects the circuit components and leaves unprotected areas between the die. The substrate is mounted on a thin tape which is supported within a rigid frame. The substrate/tape/frame assembly is transferred into a vacuum processing chamber and exposed to reactive gas plasma where the unprotected areas between the die are etched away. During this process, the frame and tape are protected from damage by the reactive gas plasma. The processing leaves the die completely separated. After etching, the substrate/tape/frame assembly is additionally exposed to plasma which removes potentially damaging residues from the substrate surface. After transfer of the substrate/tape/frame assembly out of the process chamber, the die are removed from the tape using well known techniques and are then further processed (e.g., packaged) as necessary.

Another feature of the present invention is to provide a method for plasma dicing a substrate. The substrate can have a semiconducting layer such as Silicon and/or the substrate can have a III-V layer such as GaAs. The substrate can have a protective layer such as a photoresist layer that is patterned on a circuit side of the substrate. A process chamber having a wall with a plasma source adjacent to the wall of the process chamber is provided. The plasma source can be a high density plasma source. A vacuum pump in fluid communication with the process chamber and a gas inlet in fluid communication with the process chamber can be provided. A work piece support within the process chamber is provided. A work piece is formed by placing the substrate on a carrier support. The work piece can be formed by adhering the substrate to a support film and then mounting the substrate with the support film to a frame. The support film can have a polymer layer and/or a conductive layer. The support film can be standard dicing tape. The frame can have a conductive layer and/or a metal layer. The work piece is then loaded onto the work piece support for plasma processing. An RF power source can be coupled to the work piece support to create a plasma around the work piece. A thermal communication between the work piece and the work piece support can be provided by supplying a pressurized gas such as helium from the work piece support to the work piece. An electrostatic chuck can be incorporated into the work piece support whereby the electrostatic chuck can clamp the support film to the electrostatic chuck. The electrostatic chuck can have monopolar or multipolar clamping electrodes and provide a clamping force through either a coulombic or Johnsen-Rahbek effect. The electrostatic chuck can have a diameter that is greater than a diameter of the substrate. The electrostatic chuck can have a diameter that is less than an inner diameter of the frame. The electrostatic chuck can have a flat top surface. The electrostatic chuck can have features that are less than a singulated die size. A lifting mechanism can be incorporated into the work piece support where the work piece is loaded onto the lifting mechanism. The lifting mechanism can be designed so that it only touches the frame of the work piece. A filler ring can be provided where the filler ring extends from an outer diameter of the electrostatic chuck to the lifting mechanism. The filler ring can be made from a dielectric material. A mechanical partition can be provided between the high density source and the work piece. The partition can be a screen that can be conductive that can be made of aluminum. A cover ring is disposed above the work piece. An inner diameter of the cover ring can be less than an outer diameter of the substrate. The pressure within the process chamber can be reduced through the vacuum pump and a process gas can be introduced into the process chamber through the gas inlet. A plasma is generated through the plasma source whereby the work piece is etched through the generated plasma. The temperature of the cover ring can be controlled during the plasma etching step. During the plasma etching step, the cover ring can be cooled to a temperature of less than 80° C. The cover ring can be cooled by using the wall of the process chamber and/or a heat sink. The cover ring can be temperature controlled by contacting a temperature controlled fluid. The cover ring can have a plurality of holes, a plasma resistant layer, a metal layer and/or a ceramic layer. A vacuum compatible transfer module can be provided that communicates with the process chamber. The work piece can be loaded onto a transfer arm in the vacuum compatible transfer module whereby the process chamber is maintained under vacuum during a transfer of the work piece from the vacuum compatible transfer module to the process chamber. The transfer arm can be flat, indexed to the frame, only contact the frame and/or remain substantially coplanar to the substrate during transfer. The work piece can be aligned prior to transfer into the process chamber by a mechanical alignment and/or an optical alignment. The frame and/or the substrate can be aligned prior to transfer into the process chamber.

Yet another feature of the present invention is to provide a method for plasma dicing a substrate. The substrate can have a semiconducting layer such as Silicon and/or the substrate can have a III-V layer such as GaAs. The substrate can have a protective layer such as a photoresist layer that is patterned on a circuit side of the substrate. A process chamber having a wall with a plasma source adjacent to the wall of the process chamber is provided. The plasma source can be a high density plasma source. A vacuum pump in fluid communication with the process chamber and a gas inlet in fluid communication with the process chamber can be provided. A work piece support within the process chamber is provided. A work piece is formed by placing the substrate on a carrier support. The work piece can be formed by adhering the substrate to a support film and then mounting the substrate with the support film to a frame. The support film can have a polymer layer and/or a conductive layer. The support film can be standard dicing tape. The frame can have a conductive layer and/or a metal layer. The work piece is then loaded onto the work piece support for plasma processing. An RF power source can be coupled to the work piece support to create a plasma around the work piece. A thermal communication between the work piece and the work piece support can be provided by supplying a pressurized gas such as helium from the work piece support to the work piece. An electrostatic chuck is incorporated into the work piece support whereby the electrostatic chuck clamps the work piece to the electrostatic chuck. The electrostatic chuck can be monopolar or multi-polar. The electrostatic chuck can clamp the substrate using a coulombic or Johnsen-Rahbek effect. The electrostatic chuck can have a diameter that is greater than a diameter of the substrate. The electrostatic chuck can have a diameter that is less than an inner diameter of the frame. The electrostatic chuck can have a flat top surface. The electrostatic chuck can have features that are less than a singulated die size. A lifting mechanism can be incorporated into the work piece support where the work piece is loaded onto the lifting mechanism. The lifting mechanism can be designed so that it only touches the frame of the work piece. A filler ring can be provided where the filler ring extends from an outer diameter of the electrostatic chuck to the lifting mechanism. The filler ring can be made from a dielectric material. A mechanical partition can be provided between the high density source and the work piece. The partition can be a screen that can be conductive that can be made of aluminum. A cover ring is disposed above the work piece. An inner diameter of the cover ring can be less than an outer diameter of the substrate. The pressure within the process chamber can be reduced through the vacuum pump and a process gas can be introduced into the process chamber through the gas inlet. A plasma is generated through the plasma source whereby the work piece is etched through the generated plasma. The temperature of the cover ring is controlled during the plasma etching step. During the plasma etching step, the cover ring can be cooled to a temperature of less than 80° C. The cover ring can be cooled by using the wall of the process chamber and/or a heat sink. The cover ring can have a plurality of holes, a plasma resistant layer, a metal layer and/or a ceramic layer. A vacuum compatible transfer module can be provided that communicates with the process chamber. The work piece can be loaded onto a transfer arm in the vacuum compatible transfer module whereby the process chamber is maintained under vacuum during a transfer of the work piece from the vacuum compatible transfer module to the process chamber. The transfer arm can be flat, indexed to the frame, only contact the frame and/or remain coplanar to the substrate during transfer. The work piece can be aligned prior to transfer into the process chamber by a mechanical alignment and/or an optical alignment. The frame and/or the substrate can be aligned prior to transfer into the process chamber.

Still yet another feature of the present invention is to provide a method for plasma dicing a substrate. A work piece is formed by placing the substrate on a carrier support. The work piece can be formed by adhering the substrate to a support film and then mounting the substrate with the support film to a frame. The support film can have a polymer layer and/or a conductive layer. The support film can be standard dicing tape. The frame can have a conductive layer and/or a metal layer. The work piece is loaded into a plasma processing chamber. A cover ring can be disposed above the work piece. The work piece is exposed to a first plasma etch process using a first etchant gas within the plasma processing chamber. The first etchant gas can be a halogen containing gas such as a Fluorine containing gas or a Chlorine containing gas. The first etch process can be a time division multiplexed etch process. The first plasma etch process is terminated after the die are singulated. The termination of the first plasma etch process can occur at an interface between the substrate and the support film which can be determined using a standard endpoint technique. Then, the work piece can be exposed to a second plasma etch process using a second etchant gas within the plasma processing chamber. The second plasma etch process can be a lower etch rate process designed to reduce undercut. The second etchant gas can be a second halogen containing gas such as a Fluorine containing gas or a Chlorine containing gas. The second etch process can be a second time division multiplexed etch process. Then, the work piece can be exposed to a third plasma etch process using a third etchant gas within the plasma processing chamber. The third plasma etch process can remove unwanted residues that exist on devices after exposure to the first plasma etch process and/or second plasma etch process. The third etchant gas can be a hydrogen containing gas.

Another feature of the present invention is to provide an apparatus for plasma dicing a substrate comprising a process chamber having a wall with a plasma source adjacent to the wall of the process chamber. The plasma source can be a high density plasma source. The process chamber can have a vacuum pump in fluid communication with the process chamber and a gas inlet in fluid communication with the process chamber. A work piece support within the process chamber which has an electrostatic chuck. A work piece having the substrate mounted on a carrier support is placed onto the work piece support. The work piece can have the substrate on a support film which is then mounted on a frame. The support film can have a polymer layer and/or a conductive layer. The support film can be standard dicing tape. The frame can have a conductive layer and/or a metal layer. A cover ring is disposed above the work piece and the cover ring is thermally coupled to the wall of the process chamber and/or a heat sink. The cover ring can have a plurality of holes. A mechanical partition can be placed between the high density source and the work piece. A lifting mechanism can be placed within the work piece support. A filler ring that extends from an outer diameter of the electrostatic chuck to the lifting mechanism can be included.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Similar reference characters refer to similar parts throughout the several views of the drawings.

DETAILED DESCRIPTION OF THE INVENTION

Figure 1:
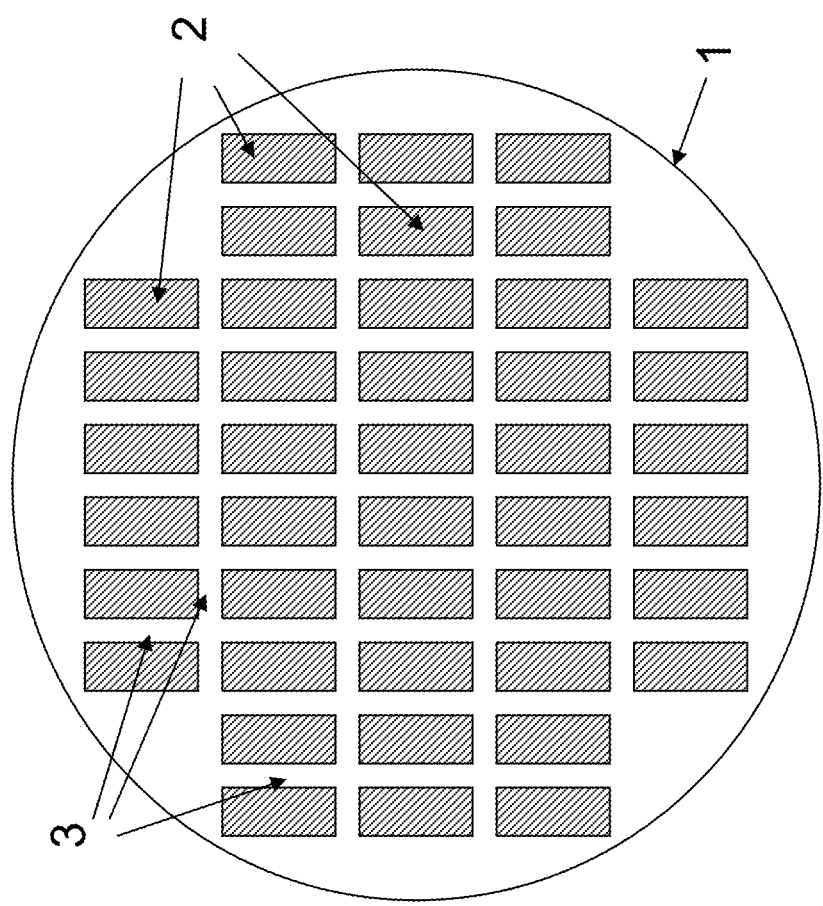
FIG. 1 is a top down view of a semiconductor substrate illustrating individual devices separated by streets.

A typical semiconductor substrate after device fabrication is illustrated in FIG. 1. The substrate (1) has on its surface a number of areas containing device structures (2) separated by street areas (3) in which there are no structures which allows for separation of the device structures into individual die. Although silicon is commonly used as a substrate material, other materials chosen for their particular characteristics are frequently employed. Such substrate materials include gallium arsenide and other III-V materials or non-semi-conductor substrates on which has been deposited a semi-conducting layer.

Figure 2:
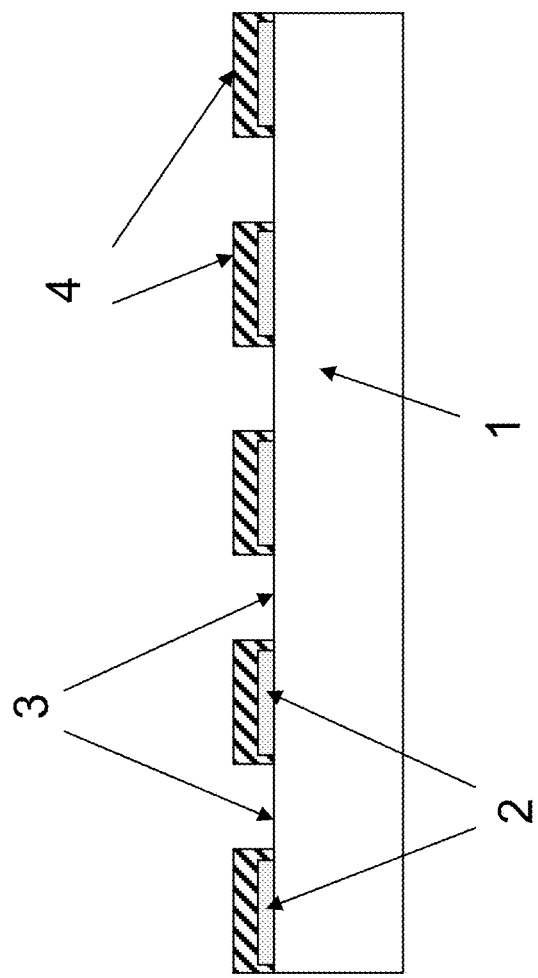
FIG. 2 is a cross-sectional view of a semiconductor substrate illustrating individual devices separated by streets.

In the present invention, as is shown in a cross sectional view in FIG. 2, the device structures (2) are then covered with a protective material (4) while the street areas (3) remain unprotected. This protective material (4) can be a photoresist, applied and patterned by well-known techniques. Some devices, as a final process step are coated with a protective dielectric layer such as silicon dioxide or PSG which is applied across the whole substrate. This can be selectively removed from the street areas (3) by patterning with photoresist and etching the dielectric material, as is well known in the industry. This leaves the device structures (2) protected by the dielectric material and the substrate (1) substantially unprotected in the street areas (3). Note that in some cases test features to check the wafer quality may be located in the street areas (3). Depending on the specific wafer fabrication process flow, these test features may or may not be protected during the wafer dicing process. Although the device pattern illustrated shows oblong die, this is not necessary, and the individual device structures (2) may be any other shape, such as hexagons, as best suits the optimum utilization of the substrate (1). It is important to note that while the previous example considers dielectric materials as the protective film, that the invention may be practiced with a wide range of protective films including semi-conductive and conductive protective films. Furthermore, the protective layer can consist of multiple materials. It is also important to note that some portion of the protective film may be an integral part of the final device structure. (e.g., a passivation dielectric, metal bonding pad, etc.)

Figure 3:
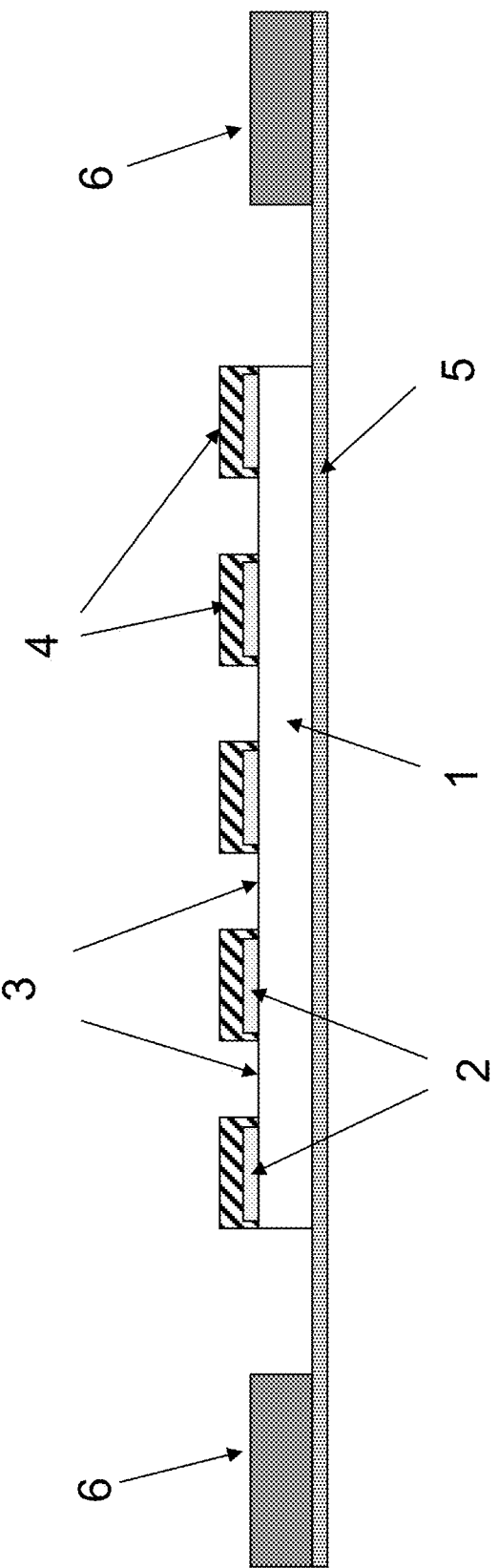
FIG. 3 is a cross-sectional view of a semiconductor substrate mounted to tape and a frame.

The substrate (1) may be thinned, typically by a grinding process, which reduces the substrate thickness to a few hundred microns to as thin as approximately 30 microns or less. As is shown in FIG. 3, the thinned substrate (1) is then adhered to a tape (5) which in turn is mounted in a rigid frame (6) to form a work piece (1A). The tape (5) is typically made from a carbon-containing polymer material, and may additionally have a thin conductive layer applied to its surface. The tape (5) provides support for the thinned substrate (1) which is otherwise too fragile to handle without breakage. It should be noted that the sequence of patterning, thinning and then mounting is not critical and the steps may be adjusted to best fit the particular devices and substrate and the processing equipment used. It is important to note that while the previous example considers a work piece (1A) that is comprised of mounting a substrate (1) on an adhesive tape (5) which in turn is attached to a frame (6), that the invention is not limited by the configuration of the wafer and carrier. The wafer carrier can be comprised a variety of materials. The carrier supports the substrate during the plasma dicing process. Furthermore, the wafer need not be attached to the carrier using an adhesive—any method that holds the wafer to the carrier and allows a means thermal communication of the substrate to the cathode is sufficient. (e.g. an electrostatically clamped carrier, a carrier with a mechanical clamping mechanism, etc.)

Figure 4:
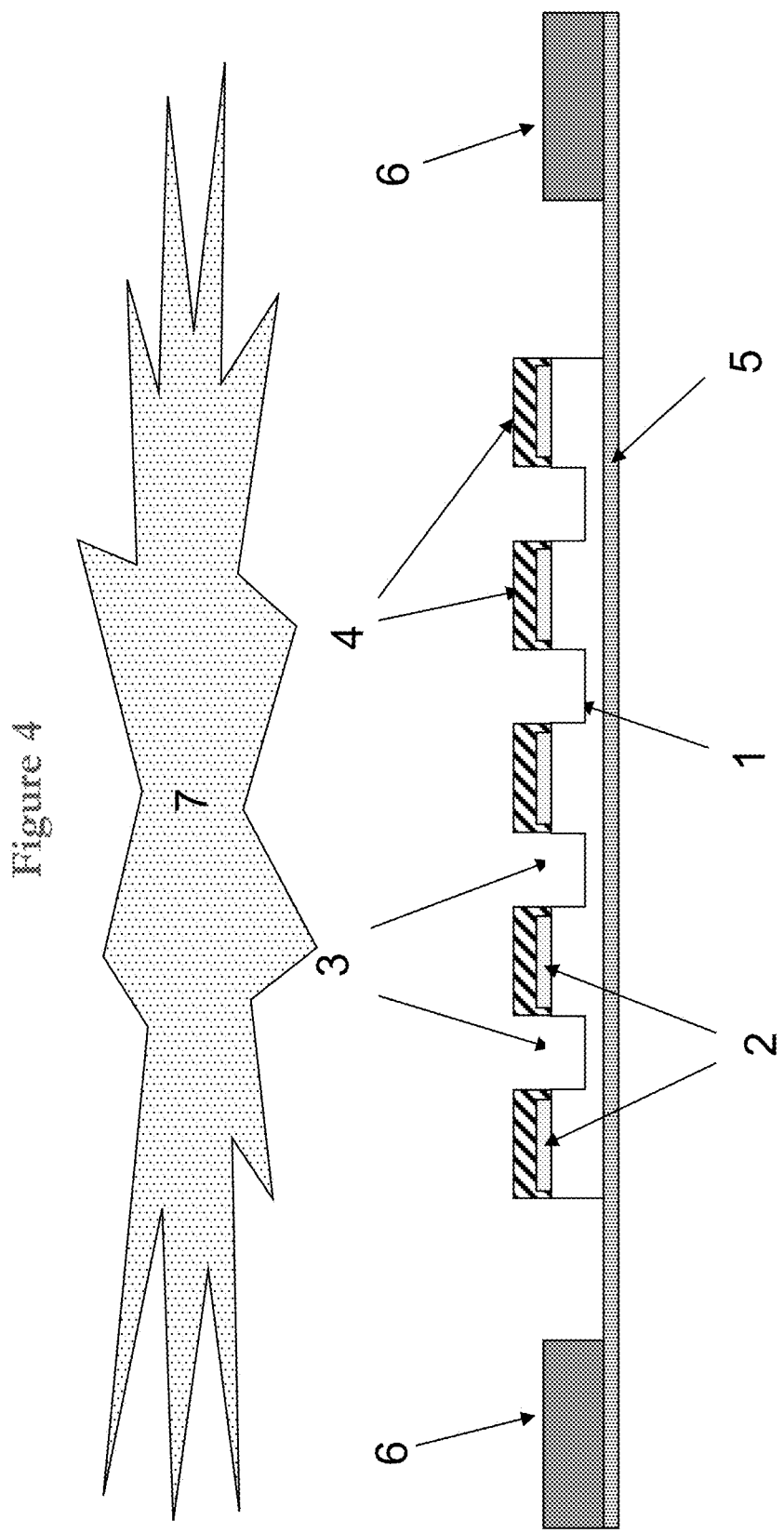
FIG. 4 is a cross-sectional view of a semiconductor substrate mounted to tape and a frame being etched by a plasma process.
Figure 5:
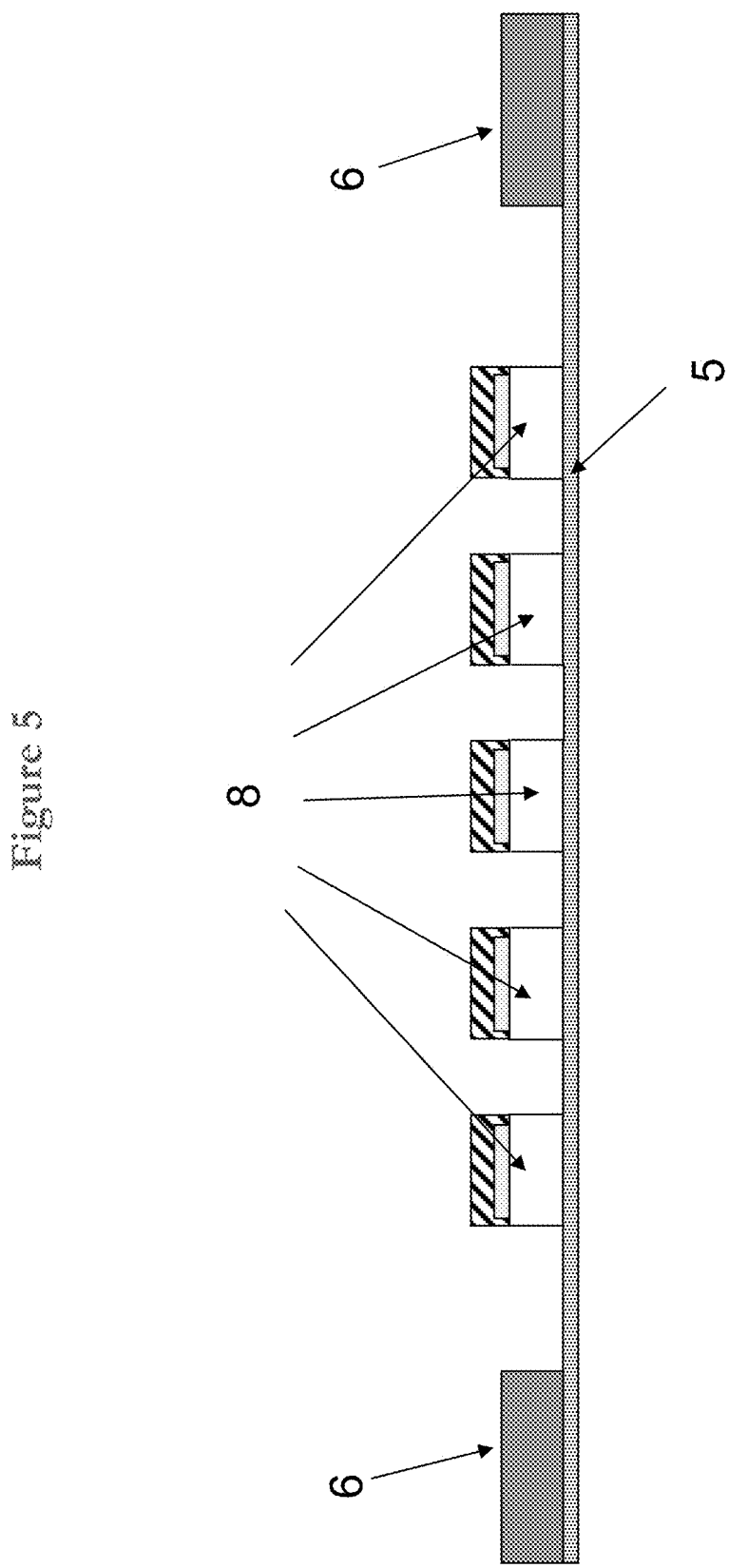
FIG. 5 is a cross-sectional view of separated semiconductor devices mounted to tape and a frame.
Figure 6:
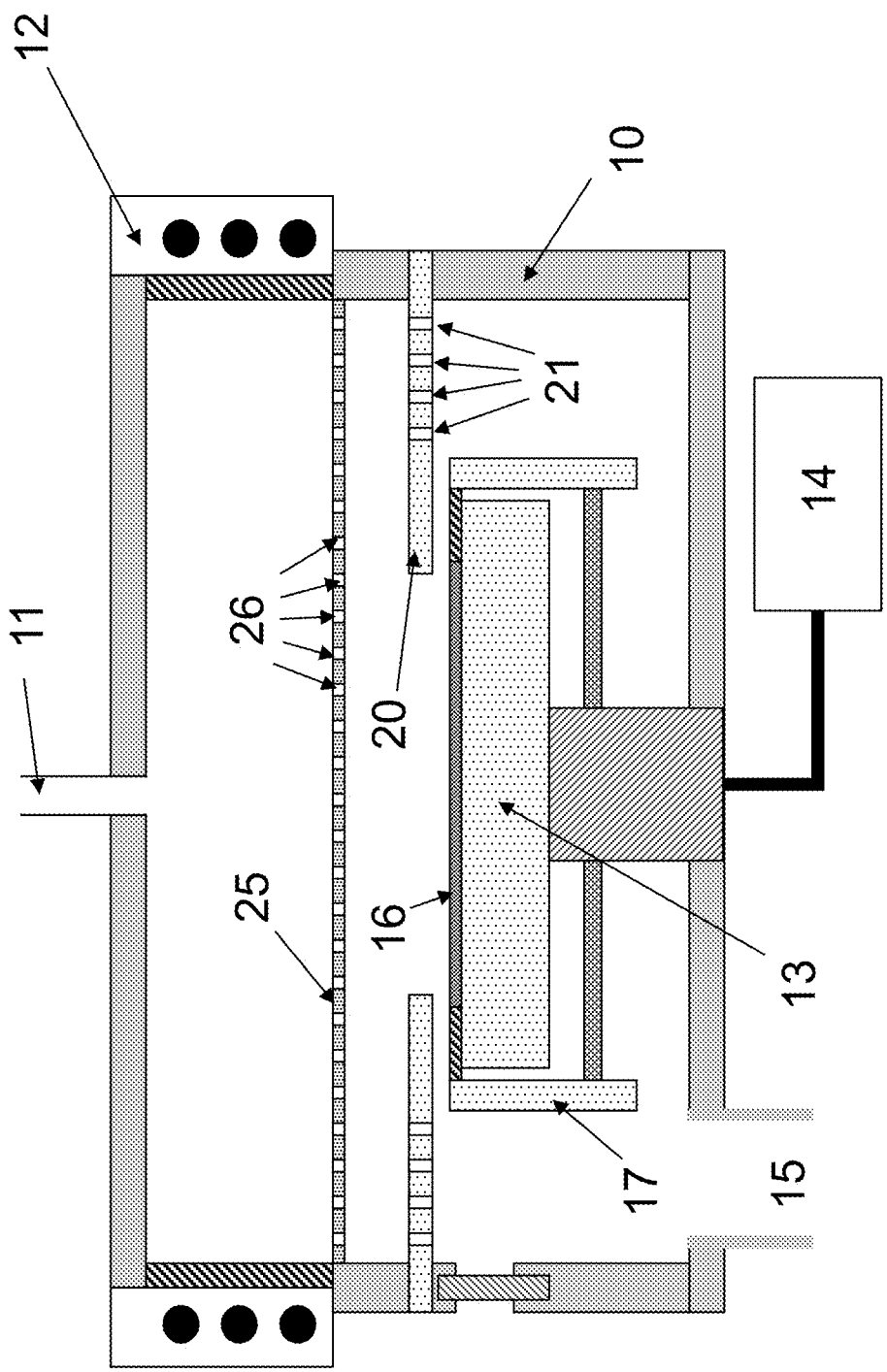
FIG. 6 is a cross-sectional view of a vacuum processing chamber.

After mounting the substrate (1) with the tape (5) in the dicing frame (6), the work piece (1A) is transferred into a vacuum processing chamber. Ideally, the transfer module is also under vacuum which allows the process chamber to remain at vacuum during transfer, reducing processing time and preventing exposure of the process chamber to atmosphere and possible contamination. As shown in FIG. 6, the vacuum processing chamber (10) is equipped with a gas inlet (11), a high density plasma source (12) to generate a high density plasma, such as an Inductively Coupled Plasma (ICP), a work piece support (13) to support the work piece (1A), an RF power source (14) to couple RF power to the work piece (1A) through the work piece support (13) and a vacuum pump (15) for pumping gas from the processing chamber (10). During processing, the unprotected areas of substrate (1) are etched away using a reactive plasma etch process (7) as shown in FIG. 4. This leaves the devices (2) separated into individual die (8) as shown in FIG. 5. In another embodiment of the invention, the unprotected areas of the substrate (1) are partially etched away using a reactive plasma etch process (7). In this case, a downstream operation, such as a mechanical breaking operation, can be used to complete the die separation. These downstream methods are well known in the art.

While the previous example describes the invention using a vacuum chamber in conjunction with a high density plasma, it is also possible to etch the unprotected areas of the substrate using a wide range of plasma processes. For example, one skilled in the art can imagine variations of the invention using a low density plasma source in a vacuum chamber or even the use of plasmas at or near atmospheric pressures.

Figure 7:
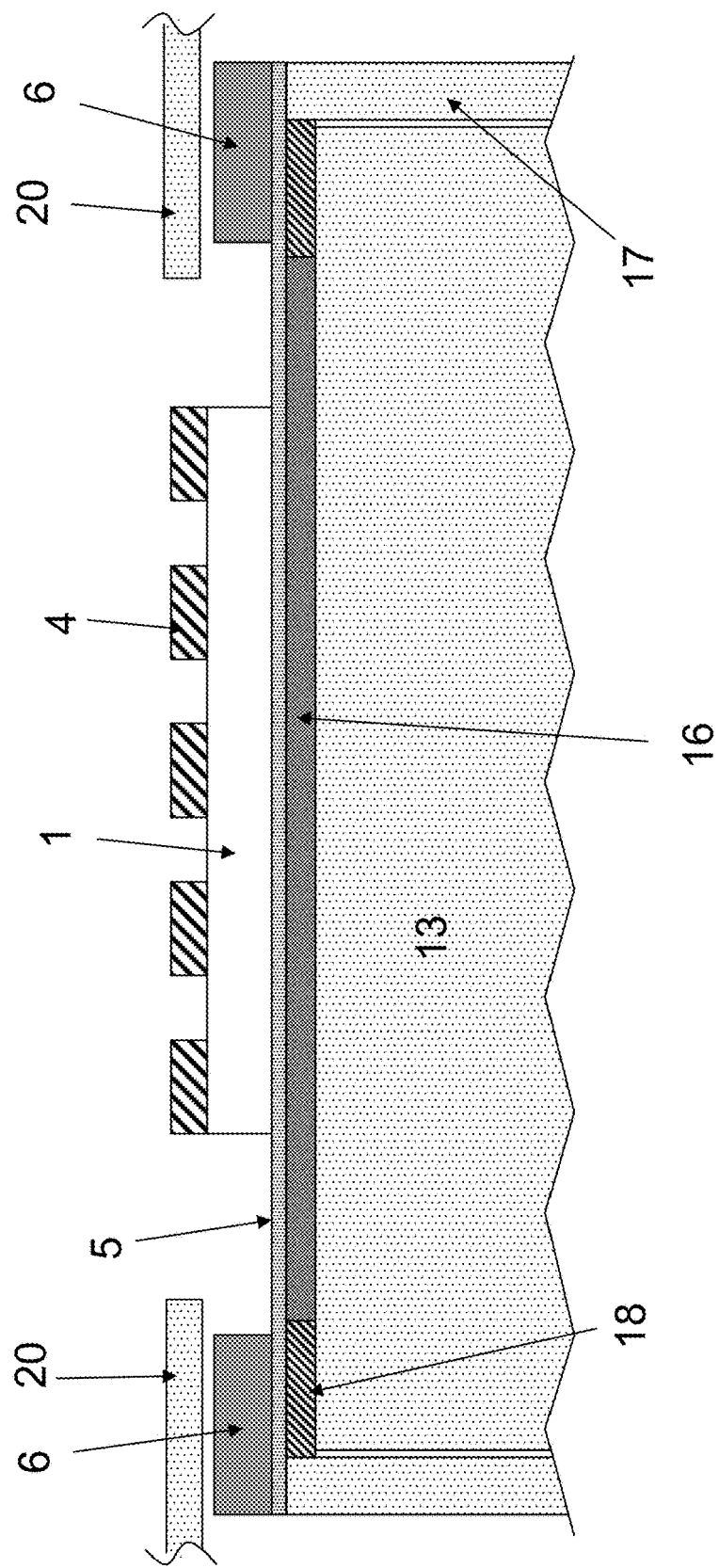
FIG. 7 is a cross-sectional of a wafer/frame in process position.
Figure 8:
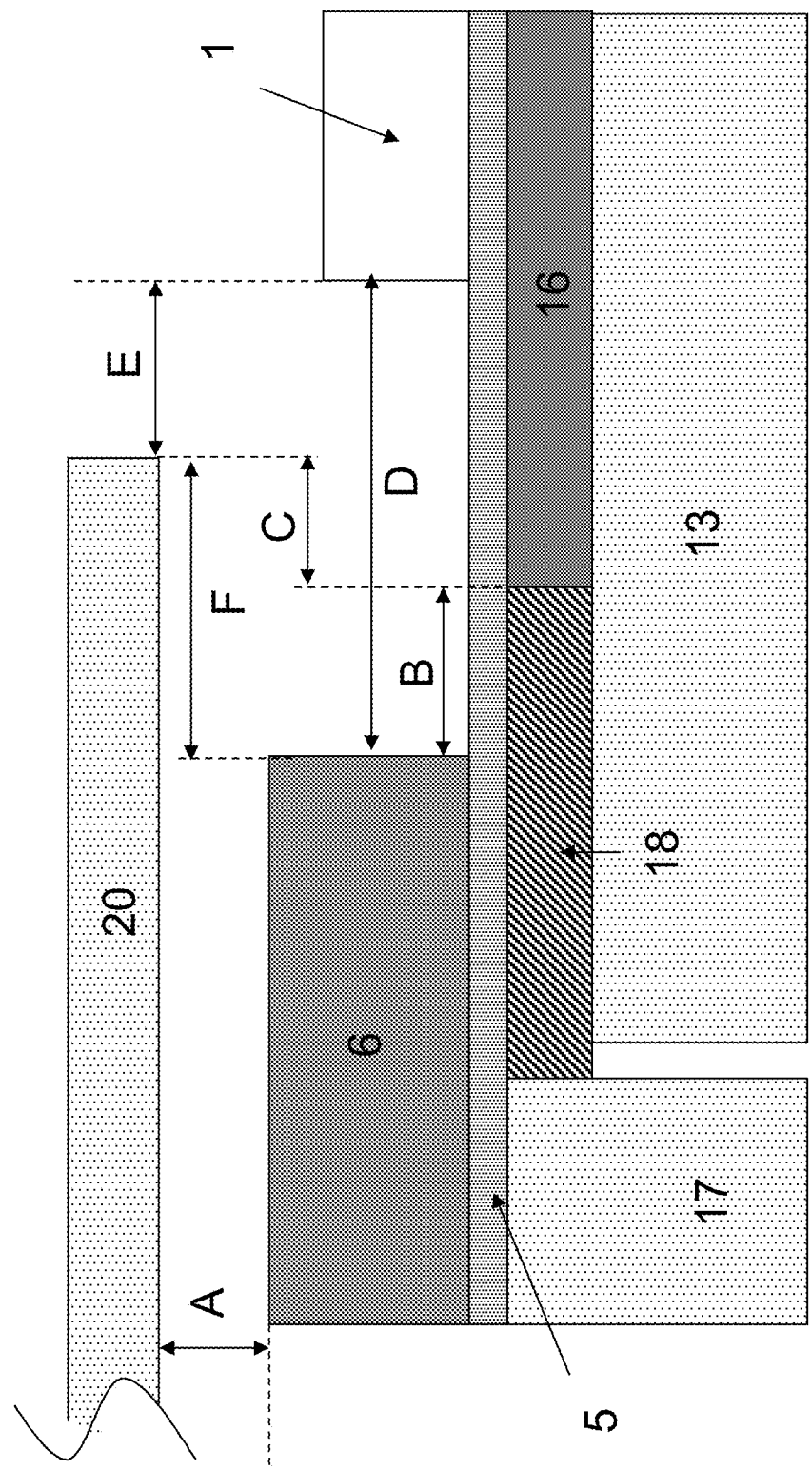
FIG. 8 is an enlarged cross-sectional view of a frame and a cover ring in a vacuum processing chamber.

When the substrate/tape/frame assembly (1A) is in the position for plasma processing, it is important that the frame (6) is protected from exposure to the plasma (7). Exposure to the plasma (7) will cause heating of the frame (6) which in turn will cause local heating of the mounting tape (5). At temperatures above approximately 100° C., the physical properties of the tape (5) and its adhesive capability may deteriorate and it will no longer adhere to the frame (6). Additionally, exposure of the frame (6) to the reactive plasma gas may cause degradation of the frame (6). Since the frame (6) is typically re-used after wafer dicing, this may limit the useful lifetime of a frame (6). Exposure of the frame (6) to the plasma (7) may also adversely affect the etch process: for example the frame material may react with the process gas, effectively reducing its concentration in the plasma which will reduce the etch rate of the substrate material, thus increasing process time. To protect the frame (6), a protective cover ring (20), as shown in FIGS. 6, 7 and 8, is positioned above the frame (6). The cover ring (20) does not touch the frame (6) since contact with the frame (6) (which would occur during transfer into the process chamber (10)) can generate undesirable particles.

In FIG. 8, dimension (A) represents the distance between the cover ring (20) and the frame (6). This dimension can range from greater than approximately 0.5 mm to less than approximately 5 mm with an optimal value of 1.5 mm. If the distance (A) is too large, plasma (7) will contact the frame (6) and the benefits of the cover ring (20) will be lost.

It is important that the cover ring (20) is temperature controlled, otherwise its temperature will increase due to exposure to the plasma (7) and in turn heat the tape (5) and the frame (6) via radiational heating, causing degradation as noted above. For the case where the cover ring (20) is cooled, cooling of the cover ring (20) is accomplished by having it in direct contact with a cooled body, such as the process chamber wall (10W) shown in FIG. 9 or a heat sink (30) located within the process chamber (10) shown in FIG. 10. To ensure that heat is adequately removed from the cover ring (20) to the heat sink (30), the cover ring (20) should be made of a material that has good thermal conductivity. Such materials include many metals, for example Aluminum, but other thermally conductive materials, such as Aluminum Nitride and other ceramics can be used. The choice of the cover ring material is chosen to be compatible with the plasma process gases used. While Aluminum is satisfactory for Fluorine based processes, an alternate material, such as Aluminum Nitride, or the addition of a protective coating, such as Aluminum Oxide may be necessary when Chlorine based processes are used. Operation temperature of the cover ring (20) during plasma processing is typically less than 80° C. which minimizes heat radiation to the tape (5) and the frame (6) and ensures that the tape (5) maintains its mechanical integrity. Alternatively, the cover ring (20) may be temperature controlled by bringing the cover ring (20) into contact with a temperature controlled fluid. This fluid can be a liquid or gas. In the case where the cover ring (20) temperature is controlled by a fluid, the cover ring (20) may contain a number of fluid channels to facilitate heat transfer. These fluid channels can be internal to the cover ring (20), externally attached, or some combination of the two.

Figure 9:
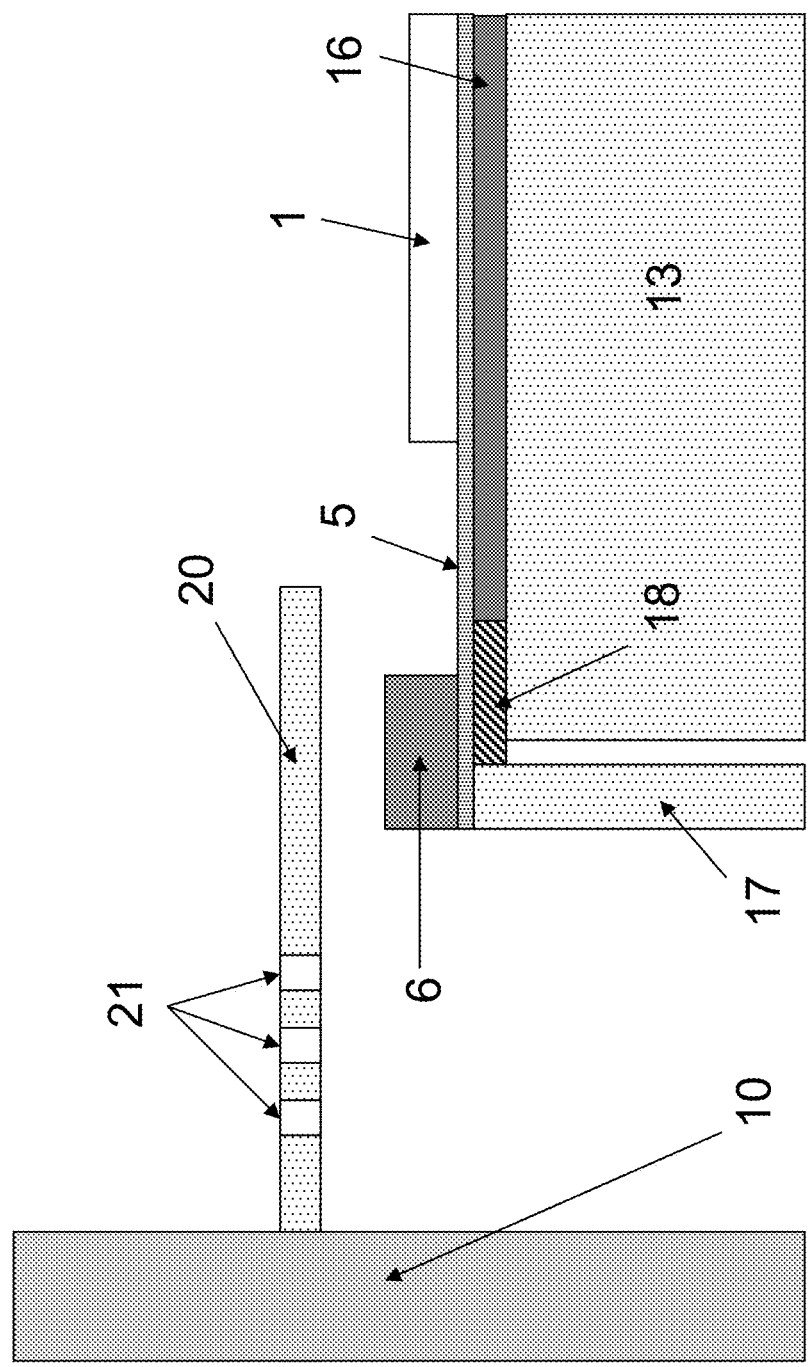
FIG. 9 is a cross-sectional view of a section of the inside the chamber with the cover ring mounted to a chamber wall.
Figure 10:
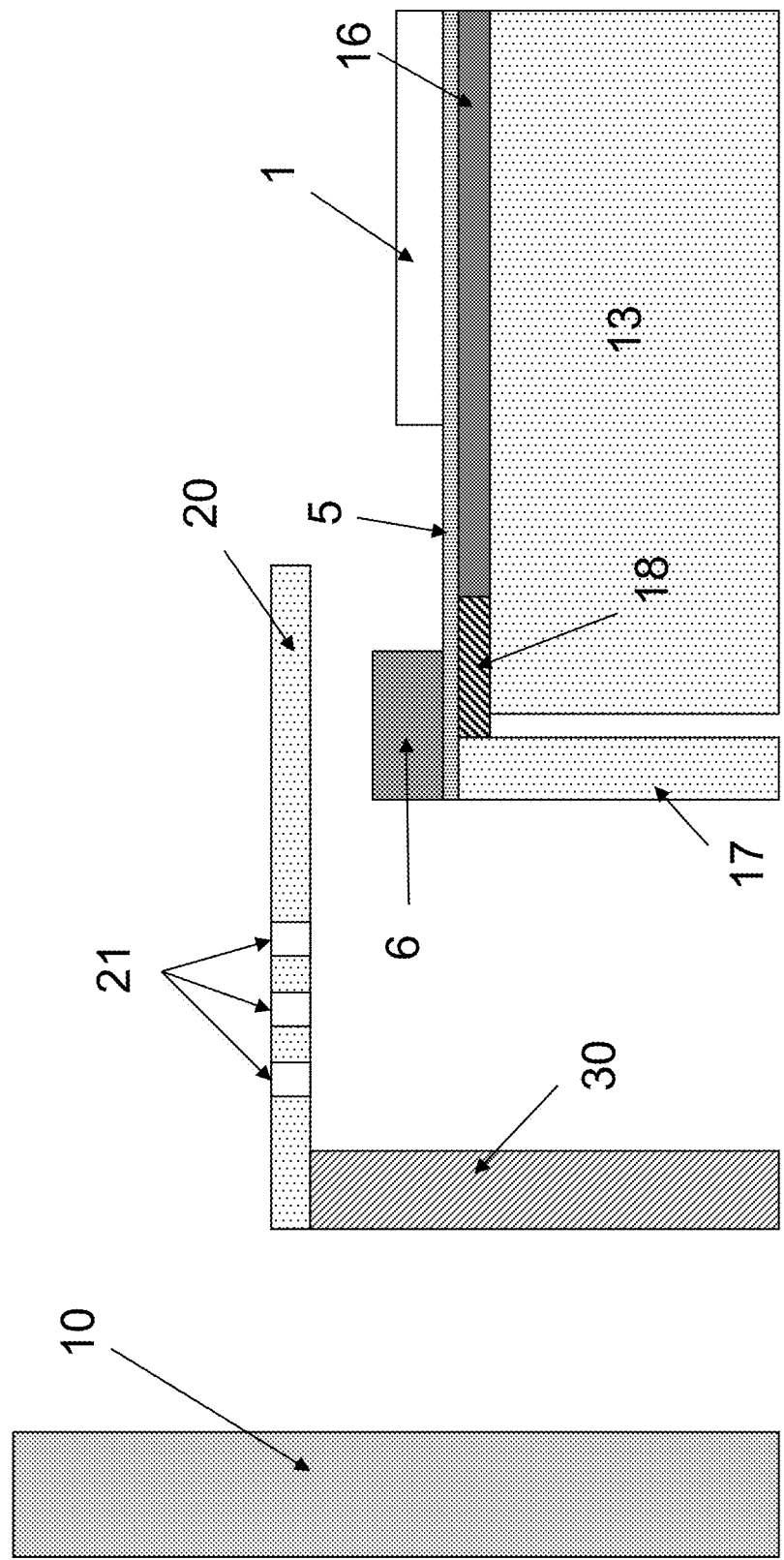
FIG. 10 is a cross-sectional view of a section of the inside the chamber with the cover ring mounted to an internal heat sink.

In one instance, the cover ring (20) can extend from the substrate diameter to the inner chamber diameter continuously. To avoid a loss in pumping conductance, which can adversely affect pressure control within the process chamber (10), a plurality of holes (21) can be added to the cover ring (20) which allows sufficient conductance of the process gas while still providing a path for heat removal from the cover ring (20). In FIGS. 9 and 10, a plurality of holes (21) arranged in a specific geometry is shown, but the density, size, pattern and symmetry of the holes (21) can vary depending on the process chamber (10) dimensions and the pumping conductance required.

Figure 11:
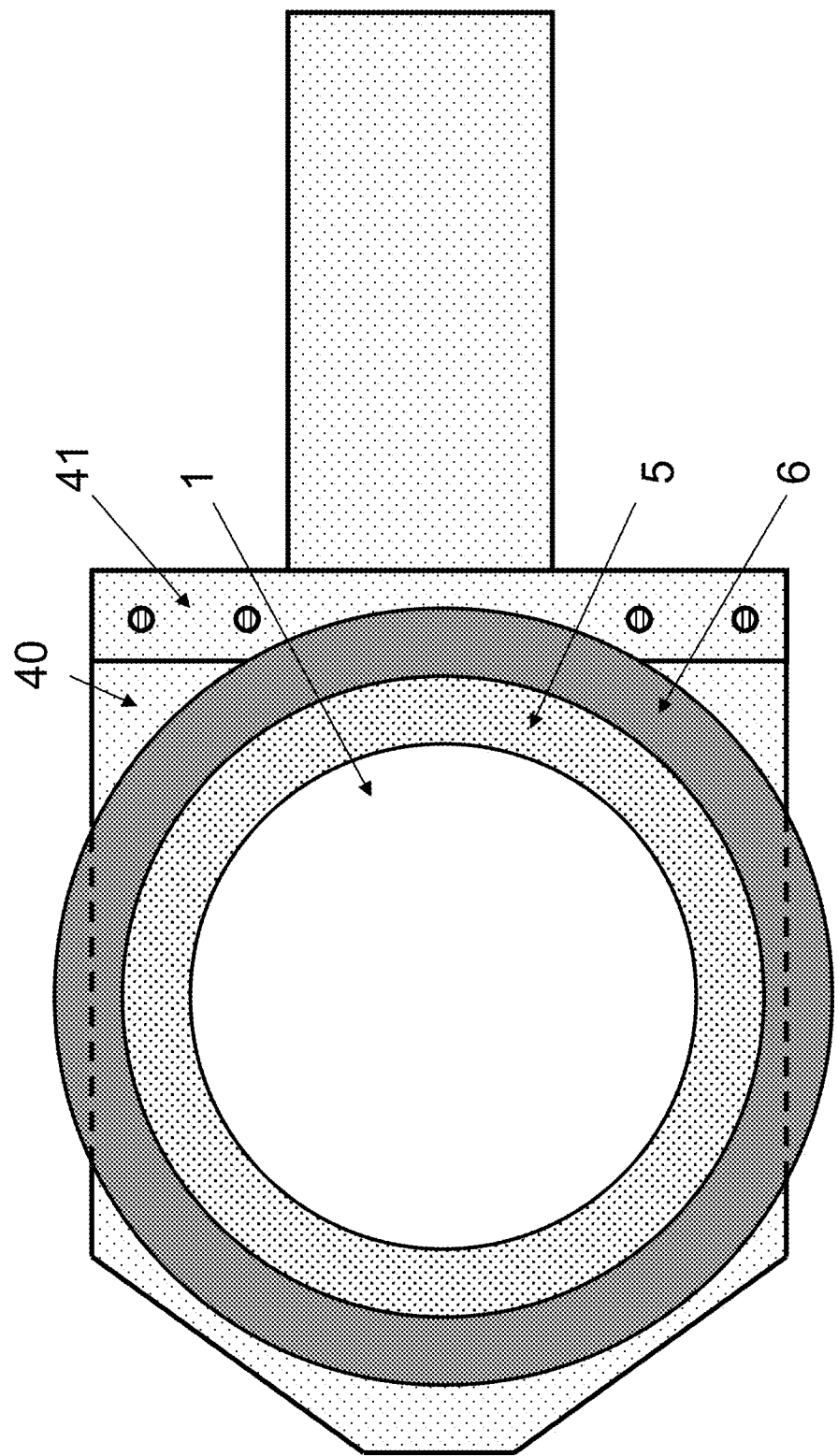
FIG. 11 is a top down view of a semiconductor substrate mounted to tape and a frame supported by a transfer arm.
Figure 12:
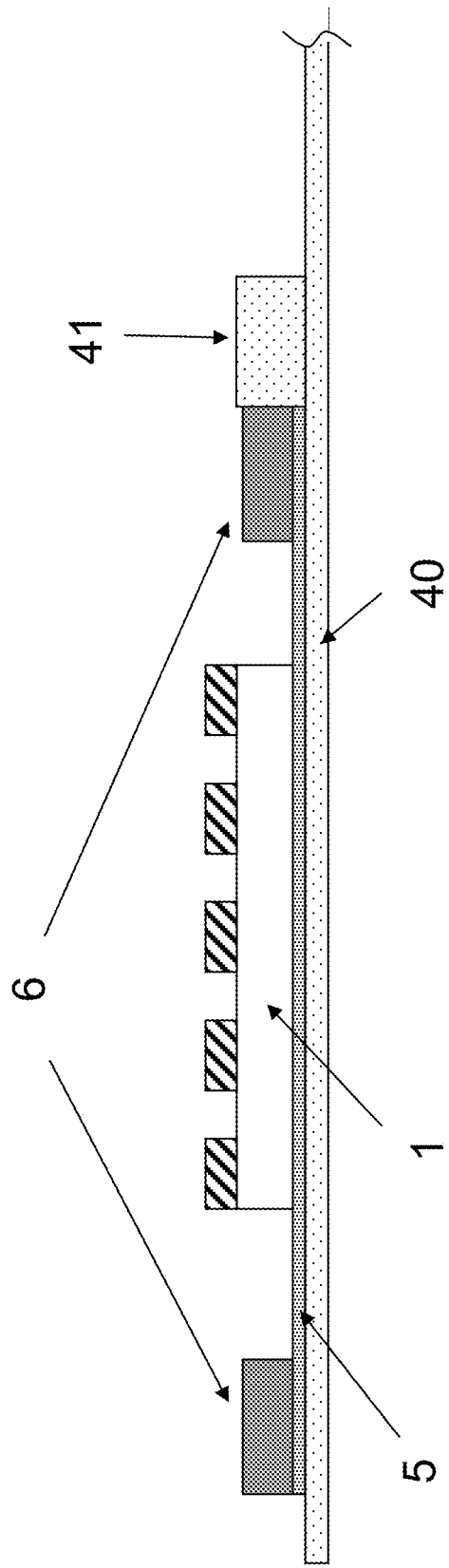
FIG. 12 is a cross-sectional view of a semiconductor substrate mounted to tape and a frame supported by a transfer arm.

The substrate/tape/frame assembly (1A) is transferred both into and out of the process chamber (10) by a transfer arm (40) that supports the frame (6) and substrate (1) so that they are maintained coplanar as shown in FIGS. 11 and 12. The transfer arm (40) may support both the tape (5) and the frame (6) or the frame (6) alone, but it is important that the assembly (1A) not be supported beneath the substrate (1) area alone because of the fragile nature of thinned substrates (1). The transfer arm (40) has an alignment fixture (41) attached to it that aligns the frame (6) in a repeatable position before being transferred into the process chamber (10). The frame (6) can also be aligned by other techniques well-known in semiconductor processing (e.g., optical alignment). The alignment can also be performed on the substrate (1) by such well-known techniques. It is important that the substrate/tape/frame assembly (1A) be aligned before placement within the process chamber (10) to avoid mis-processing as explained below.

In FIG. 8, the dimension (D) represents the distance between the outer diameter of the substrate (1) and the inner diameter of the frame (6). This may be 20 mm to 30 mm (e.g., Disco Corporation dicing frame is 250 mm for 200 mm substrates, so that the dimension (D) is nominally 25 mm). During mounting of the wafer (1) on the tape (5) within the frame (6), the deviation of wafer (1) placement may be as much as 2 mm so that dimension (E), which is the distance between the substrate (1) outer diameter and the inner diameter of the cover ring (20) can also vary from assembly to assembly by up to 2 mm. If at some point (E) is less than zero the cover ring (20) will overlay the edge of the substrate (1). This point will be shadowed and prevented from etching, which can prevent die separation and cause problems in subsequent processing steps. Alignment of the substrate/tape/frame assembly (1A) prior to transfer is required to prevent such problems. Further, to additionally ensure that dimension (E) is not less than zero, the cover ring inner diameter should be greater than the diameter of the substrate (1) with a preferred diameter 5 mm greater than the substrate (e.g., 205 mm cover ring inner diameter for 200 mm substrate). Dimension (F) in FIG. 8 represents the distance from the inner diameter of the cover ring (20) to the inner diameter of the frame (6). Alignment of the frame (6) prior to transfer into the process chamber (10) ensures that (F) remains constant for the entire circumference around the substrate (1) and that any portion of tape (5) that is not contacted by the Electrostatic chuck (ESC) (16) is shadowed from the plasma (7).

Figure 13:
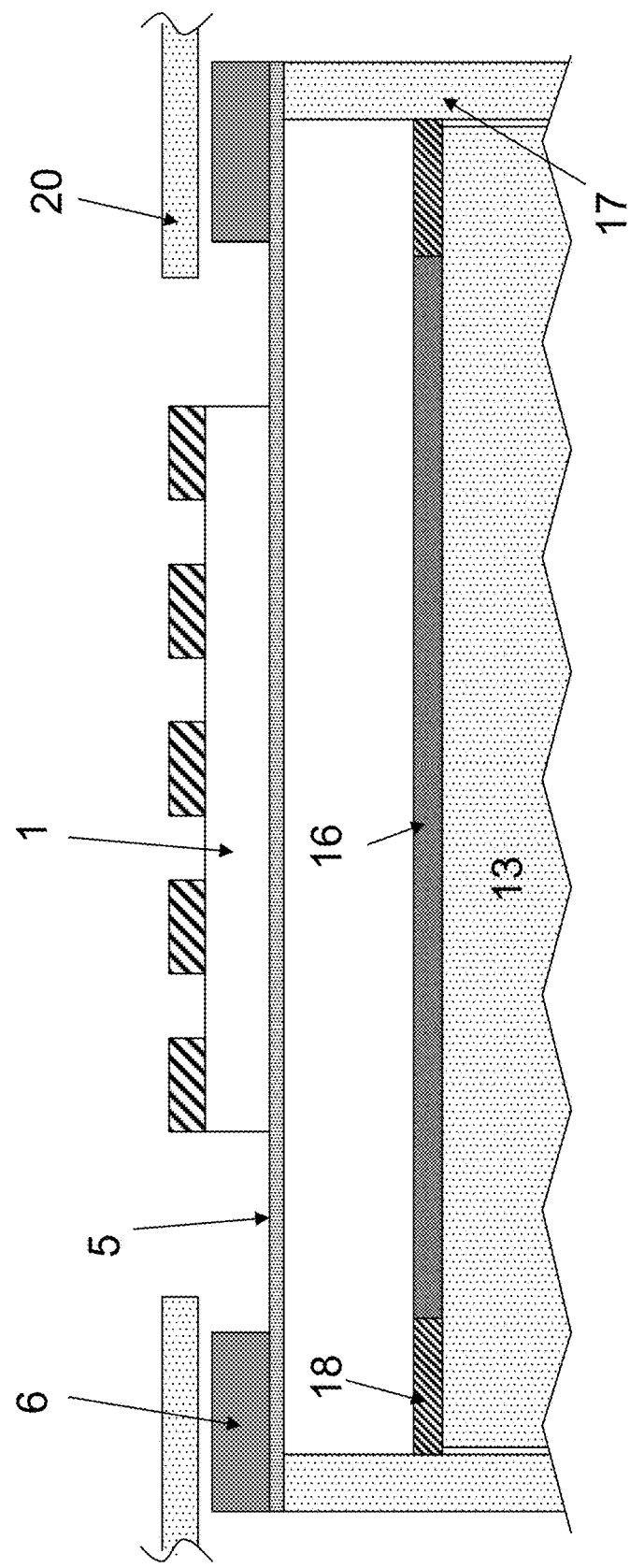
FIG. 13 is a cross-sectional view of a wafer/frame in a transfer position.

When the substrate/tape/frame assembly (1A) is transferred into the process chamber (10), it is placed onto the lifting mechanism (17) and removed from the transfer arm (40). The reverse process occurs during transfer of the substrate/tape/frame assembly (1A) out of the process chamber (10). The lifting mechanism (17) touches the frame (6) area and provides no point contact to the substrate (1). Point contact to the substrate (1) can cause damage to the substrate (1), particularly after die separation and unloading of the substrate/tape/frame assembly (1A), since the flexibility of the tape (5) would cause the die to contact each other and damage to occur. FIG. 13 shows the lifting mechanism (17) contacting the frame (6) from the underside: however the frame (6) can also be removed from the transfer arm (40) by contact with the top surface or outer diameter using a clamping device. To process the substrate (1), the frame (6), the work piece support (13), and the cover ring (20) move relative to each other. This can be accomplished by moving either the cover ring (20), the work piece support (13), or the lifting mechanism (17) or any combination of the three.

Figure 14:
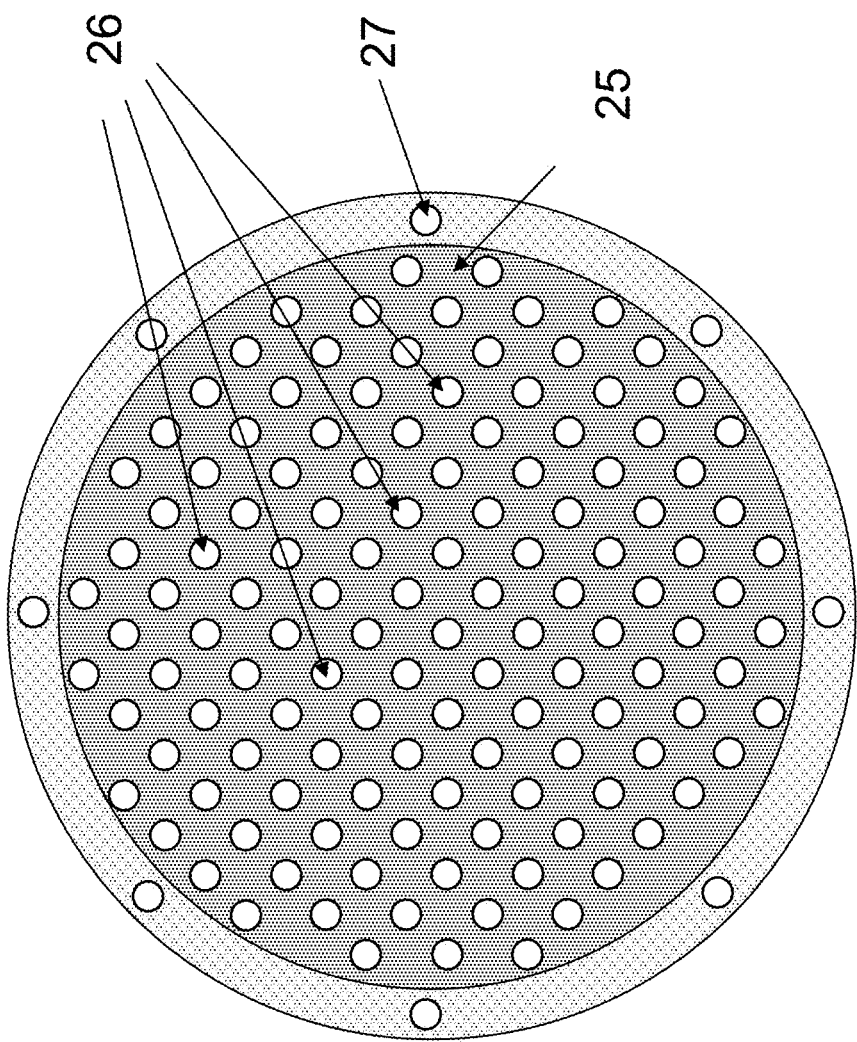
FIG. 14 is a top view of a screen.

During plasma processing, heat is transferred to all of the surfaces the plasma (7) touches including the substrate (1), tape (5), and frame (6). The cover ring (20) will minimize the heat transfer to areas of the tape (5) and the frame (6), but the substrate (1) must remain exposed to the plasma (7) for processing. As shown in FIG. 6, a conductive screen (25) (e.g., made from aluminum or aluminum coated with an appropriate plasma resistant coating) can be placed between the substrate (1) and the plasma (7). This will reduce ion bombardment on the substrate (1) and thus reduce heating of the substrate (1). FIG. 14 shows the screen (25) is provided with a plurality of holes (26) which still allows neutral species from the plasma (7) to reach the substrate (1) such that the etch rate is only slightly reduced. Holes (27) allow for mounting of the screen (25) to the processing chamber (10).

Additional cooling of the substrate (1) is provided by the use of an Electrostatic chuck (ESC) (16). Such ESCs (16) are commonly used in semiconductor processing to apply downward force to the substrate (1) while a pressurized gas such as Helium is maintained between the substrate (1) and the electrode. This ensures that heat transfer can occur between the substrate (1) and the electrode, which is cooled. Typically, ESCs (16) are the same diameter or smaller than the substrate (1) to prevent unwanted exposure of the ESC (16) surface to potentially corrosive plasma gases that can decrease the lifetime of the ESC (16). With a substrate/tape/frame assembly (1A), the area outside the diameter of the substrate (1) is tape (5). Using a typical ESC (16), because the cover ring (20) is larger than the diameter of the substrate (1), there would be an area of tape (5) exposed to the plasma process that is not being clamped and cooled by the ESC (16) or being shielded from the plasma (7) by the cover ring (20). Such an area of tape (5) would reach a high temperature and possibly fail. Thus, FIG. 8 shows the use of an ESC (16) that is made purposely larger than the substrate diameter so that any tape (5) which is exposed to the plasma in region (E) is also clamped and cooled. This diameter can be extended outwards to the outer diameter of the frame (6), but is preferred to be 2 mm less than the inner diameter of the frame (6).

FIG. 8 shows a filler ring (18) that extends from the outer diameter of the ESC (16) to the lifting mechanism (17). This filler ring (18) is used to prevent the back surface of any exposed tape (5) from being contacted by the plasma (7). Although a separate filler ring (18) is shown, an extension of the ESC (16) would also prevent plasma (7) exposure to the backside of the tape (5). The filler ring (18) is typically made of a dielectric material, such as a ceramic (e.g., Aluminum Oxide) or a plastic material, (e.g., polytetrafluoroethylene (PTFE, Teflon)) selected for both its low thermal conductivity and its low electrical conductivity. Typical ESCs (16) used in semiconductor processing have a pattern of shallow features fabricated on their surface to facilitate Helium distribution or to minimize contact with the backside of a substrate (1) to reduce particle formation. Such an ESC (16) can be used for plasma dicing when a substrate (1) is separated into multiple die, providing the feature dimensions on the ESC surface are smaller than the die size. When the die size approaches and becomes smaller than the ESC feature size, the tape will now conform to the features and flex, possibly causing the die to touch each other which can cause damage. The use of a substantially coplanar ESC surface eliminates this problem. Note that though the preceding example describes an ESC that cools the substrate, for some materials (e.g. approximately 180° C. for indium containing substrates) that require a higher temperature to facilitate the plasma etch process, a higher temperature controlled ESC (16) temperature may be desirable.

Figure 15:
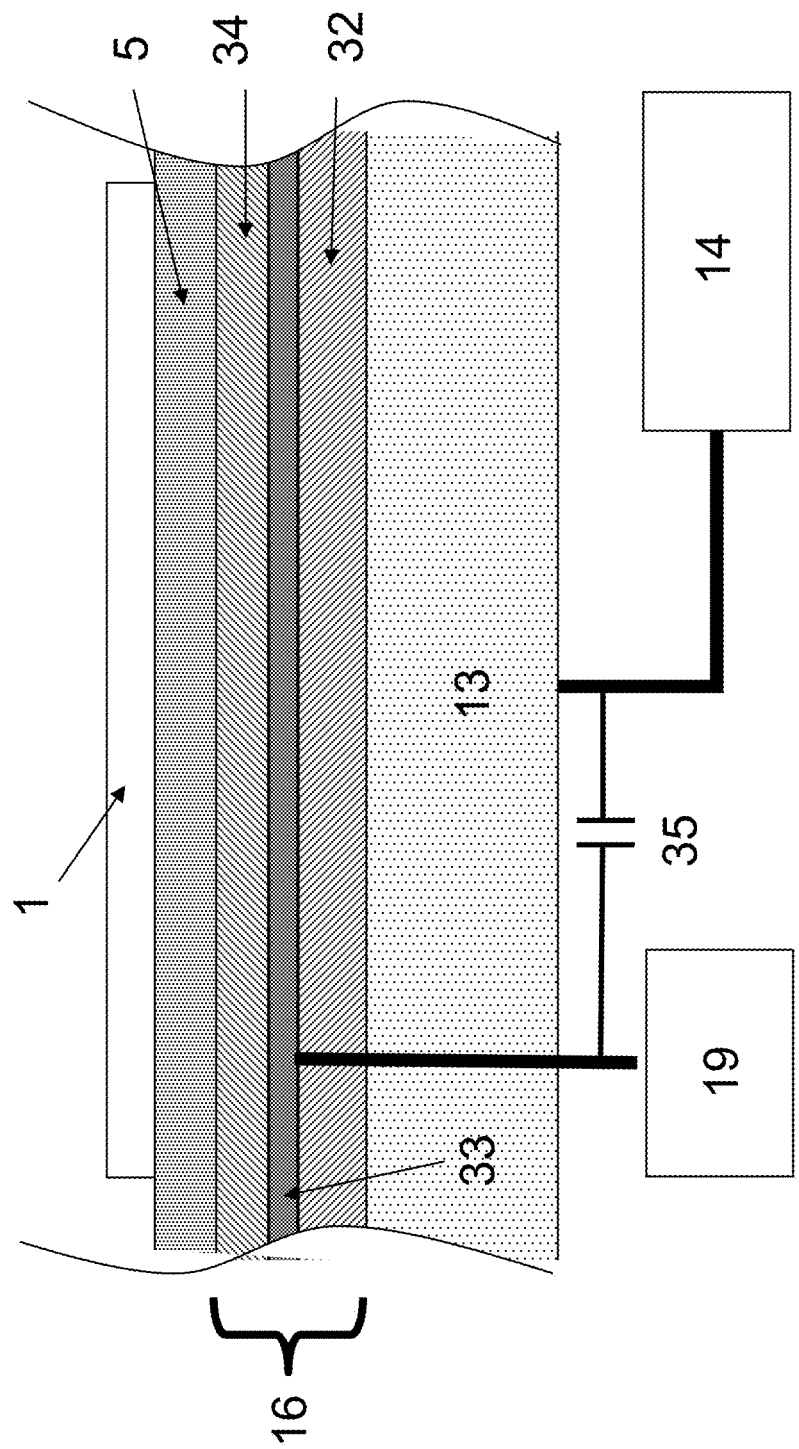
FIG. 15 is a cross-sectional view of an electrostatic chuck.
Figure 16:
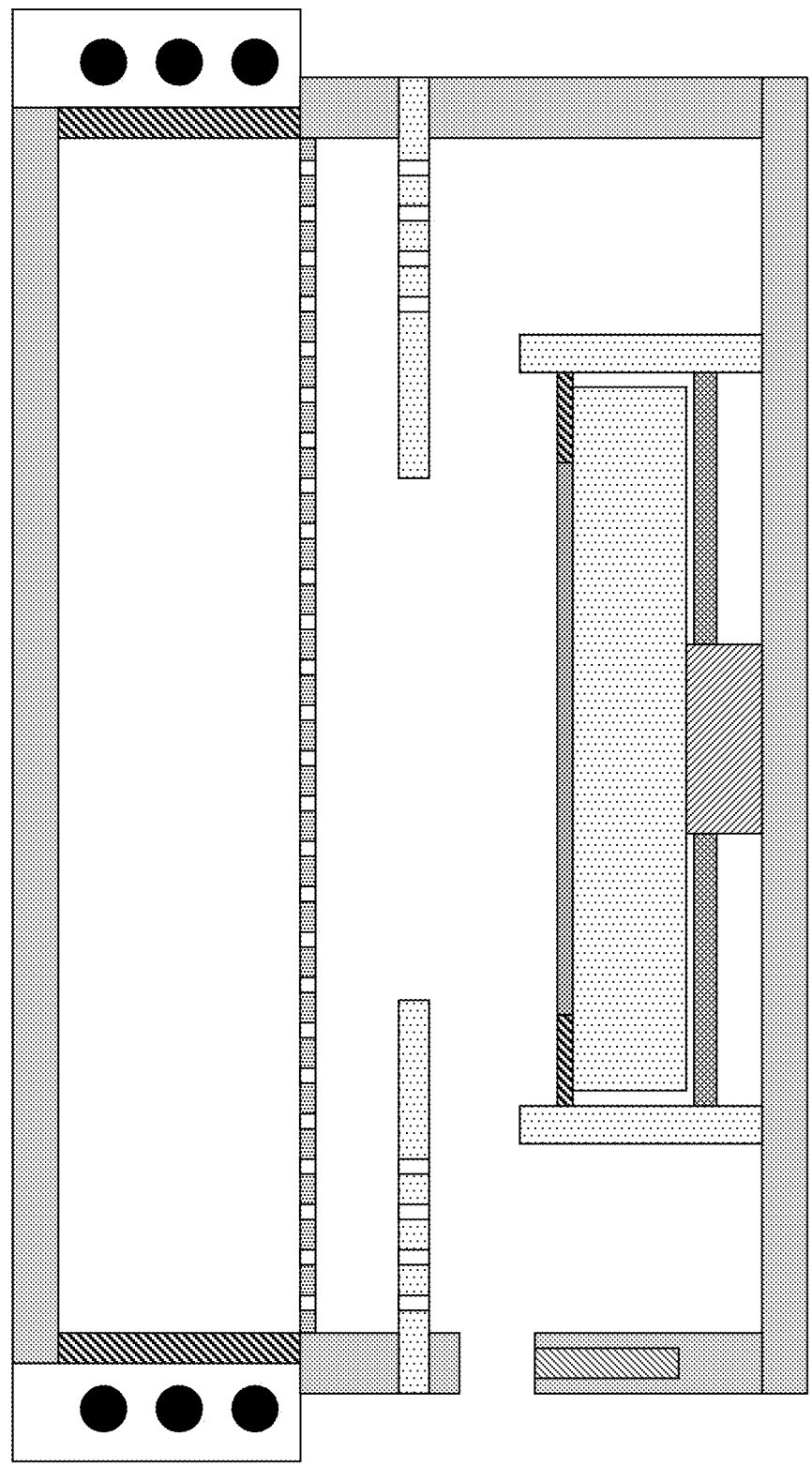
FIG. 16 is a schematic view of a chamber in a transfer position.

A typical ESC (16) (coulombic design of FIG. 15) consists of one or more electrodes (33) to which a high voltage (19) is applied, separated from the work piece support (13) by a thick insulating layer (32) and separated from the material to be clamped by a thin layer of dielectric material (34). The clamping force generated by electrostatic forces increases as the thickness of this dielectric layer (34) decreases and increases as the voltage applied increases. In the present instance, when the substrate (1) is mounted on an insulating tape (5), the thickness of the tape (5) adds to the total dielectric thickness interposed between the electrode (33) and the substrate (1). This total thickness should not be determined primarily by the tape thickness, since this is likely to vary, resulting in a variable clamping performance. Rather the ESC dielectric (34) should be relatively thick (of the order of a few 100 microns) to maintain a clamping performance independent of tape thickness. A high clamping force can be achieved by operating at a high clamping voltage (up to approximately 10 kV).

During plasma processing, RF power (14) is coupled to the substrate (1) to control ion bombardment on the substrate (1) and control the etch characteristics. The frequency of this RF may vary from 100's of MHz down to a few hundred kHz. When etching a substrate material down to an insulating layer (in this instance the mounting tape), problems with the etch associated with charging of the insulating layer are well known. Such problems include localized severe undercutting at the substrate/insulator interface which is undesirable during die separation, since this affects the performance of the singulated die. As is well known in the art, such charging problems can be reduced by operating at low RF frequencies and additionally pulsing or modulating the RF power at low frequency. Since RF coupling at such low frequency is not efficient through a thick dielectric material (32), the RF coupling to the substrate (1) is preferably via the one or more ESC electrodes, for example via a coupling capacitor (35) rather than via the RF powered work piece support (13). To maintain uniform RF coupling to the substrate (1), the ESC electrode or electrodes should also be uniformly disposed behind the substrate (1). This is difficult to achieve if multiple electrodes are used, since the necessary gaps between the electrodes result in a local variation in the RF coupling which adversely affects the quality of the etch, particularly the undercutting at the substrate/tape interface. A preferred embodiment of the ESC design therefore incorporates a so called monopolar design, in which a single electrode is used to provide the clamping force. Additionally, there should be as few as possible penetrations through this electrode (for example as for pin lifts) since these penetrations will also disturb the RF coupling and degrade the etch performance.

The substrate can be processed using techniques well known in the semiconductor industry. Silicon substrates are generally processed using a Fluorine based chemistry such as $SF_6$. $SF_6/O_2$ chemistry is commonly used to etch Silicon because of its high rate and anisotropic profile. A disadvantage of this chemistry is its relatively low selectivity to masking material for example to photoresist which is 15-20:1. Alternatively a Timed Division Multiplex (TDM) process can be used which alternates between deposition and etching to produce highly anisotropic deep profiles. For example, an alternating process to etch Silicon uses a $C_4F_8$ step to deposit polymer on all exposed surfaces of the Silicon substrate (i.e., mask surface, etch sidewalls and etch floor) and then an $SF_6$ step is used to selectively remove the polymer from the etch floor and then isotropically etch a small amount of silicon. The steps repeat until terminated. Such a TDM process can produce anisotropic features deep into Silicon with selectivities to the masking layer of greater than 200:1. This then makes a TDM process the desired approach for plasma separation of Silicon substrates. Note that the invention is not limited to the use of fluorine containing chemistries or a time division multiplex (TDM) process. For example, silicon substrates may also be etched with Cl, HBr or I containing chemistries as is known in the art.

For III-V substrates such as GaAs, a Chlorine based chemistry is extensively used in the semiconductor industry. In the fabrication of RF-wireless devices, thinned GaAs substrates are mounted with the device side down onto a carrier, where they are then thinned and patterned with photoresist. The GaAs is etched away to expose electrical contacts to the front side circuitry. This well-known process can also be used to separate the devices by the front side processing described in the above mentioned invention. Other semiconductor substrates and appropriate plasma processes can also be used for the separation of die in the above mentioned invention.

To further reduce the problems associated with charging at the substrate/tape interface, the process can be changed at the point at which the interface is exposed to a second process which has less tendency to undercut and is typically a lower etch rate process. The point in time at which the change takes place depends upon the substrate thickness, which is likely to vary. To compensate for this variability, the time at which the substrate/tape interface is reached is detected using an endpoint technique. Optical techniques which monitor the plasma emission are commonly used to detect endpoint and U.S. Pat. Nos. 6,982,175 and 7,101,805 describe such an endpoint technique which is appropriate to a TDM process.

After singulation of the semiconductor substrate there can be unwanted residues that exist on the devices. Aluminum is commonly used as an electrical contact for semiconductor devices and when exposed to Fluorine based plasmas a layer of $AlF_3$ is formed on its surface. $AlF_3$ is nonvolatile under normal plasma processing conditions and is not pumped away from the substrate and out of the system and remains on the surface after processing. $AlF_3$ on Aluminum is a common cause of failure for devices because the bonding strength of wires to the electrical contacts is greatly reduced. Thus the removal of the $AlF_3$ from the surface of the electrical contacts after plasma processing is important. Wet methods can be used; however, this becomes difficult because of the fragile nature of the separated die, and the possible damage to the tape causing die release. Therefore, the process can be changed to a third process while the substrate is still within the vacuum chamber, to a process designed to remove any $AlF_3$ formed. U.S. Pat. No. 7,150,796 describes a method for in-situ removal of $AlF_3$ using an Hydrogen based plasma. Likewise, an in-situ treatment can be used to remove other halogen-containing residues when other halogen-containing gases are used to etch the substrate.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. An apparatus for plasma dicing a substrate comprising:
a process chamber having a vertical side wall;
an inductively coupled plasma source adjacent to the vertical side wall of the process chamber;
a work piece support within the process chamber, the work piece support having an electrostatic chuck;
a screen connected to the vertical side wall of the process chamber, said screen having a plurality of holes, said screen is vertically positioned below said inductively coupled plasma source and said screen is vertically positioned above the work piece support; and
a cover ring connected to the vertical side wall of the process chamber such that said cover ring is vertically positioned above the work piece support and said cover ring is vertically positioned below said screen, said cover ring having an inner opening diameter vertically disposed above the electrostatic chuck, said inner opening diameter of said cover ring is smaller than an outer diameter of the electrostatic chuck.

2. The apparatus according to claim 1 wherein the electrostatic chuck is monopolar.

3. The apparatus according to claim 2 wherein the electrostatic chuck further comprising a dielectric having a thickness greater than 100 microns.

4. The apparatus according to claim 1 wherein said cover ring further comprising a plurality of through holes positioned outside the outer diameter of the electrostatic chuck.

5. The apparatus according to claim 4 wherein said cover ring is a stationary cover ring.

6. The apparatus according to claim 5 wherein said cover ring further comprising a plurality of fluid channels.

* * * * *